United States Patent
Ngan

(10) Patent No.: US 6,176,978 B1
(45) Date of Patent: *Jan. 23, 2001

(54) PASTING LAYER FORMATION METHOD FOR HIGH DENSITY PLASMA DEPOSITION CHAMBERS

(75) Inventor: Kenny King-tai Ngan, Fremont, CA (US)

(73) Assignee: Applied Materials, Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/914,580

(22) Filed: Aug. 18, 1997

(51) Int. Cl.⁷ ................................................... C23C 14/00
(52) U.S. Cl. ............................... 204/192.12; 204/192.13; 204/192.17; 204/192.22
(58) Field of Search ................ 204/192.12, 192.13, 204/298.03, 298.06, 192.17, 192.22; 427/576

(56) References Cited

U.S. PATENT DOCUMENTS

| | | |
|---|---|---|
| 4,115,184 | 9/1978 | Poulsen . |
| 4,421,592 * | 12/1983 | Shuskus .................... 156/613 |
| 5,178,739 | 1/1993 | Barnes et al. ................ 204/192.12 |
| 5,380,414 * | 1/1995 | Tepman ........................ 204/192.3 |
| 5,589,041 | 12/1996 | Lantsman . |
| 5,650,032 | 7/1997 | Keller et al. ..................... 156/345 |

FOREIGN PATENT DOCUMENTS

| | | |
|---|---|---|
| 0 467 046 | 1/1992 | (EP) . |
| 0 650 182 | 4/1995 | (EP) . |
| 0 680 072 | 11/1995 | (EP) . |
| 0 732 728 | 9/1996 | (EP) . |
| 0 758 148 | 2/1997 | (EP) . |
| 0 762 470 | 3/1997 | (EP) . |

OTHER PUBLICATIONS

European Search Report for Application No. EP 98 30 2646.

* cited by examiner

*Primary Examiner*—Benjamin Utech
*Assistant Examiner*—Matthew Anderson
(74) *Attorney, Agent, or Firm*—Dugan & Dugan

(57) ABSTRACT

The present invention provides a method of reducing particles within a deposition chamber without affecting bias voltage repeatability in subsequently processed wafers. Particularly, it has been discovered that within a high density plasma deposition chamber, the first wafer processed following deposition of a pasting layer may exhibit inconsistent quality as compared to subsequently processed wafers. It has further been discovered that such altered quality arises due to inconsistent bias voltage coupling between a wafer support and a wafer positioned thereon. To maintain consistent bias voltage coupling a transitional layer is deposited within the deposition chamber as part of the pasting process. It is believed the transitional layer affects the chamber's environment (chamber surfaces and atmosphere) which in turn affects bias voltage coupling between the wafer support and a wafer positioned thereon. Preferably the transitional layer is the same layer deposited on production wafers. Most preferably the present inventive process is employed within a high density plasma deposition chamber configured to deposit titanium-nitride and the inventive process deposits a titanium pasting layer followed by a transitional layer of titanium-nitride deposited by a high density plasma deposition technique, on a non-production object.

20 Claims, 3 Drawing Sheets

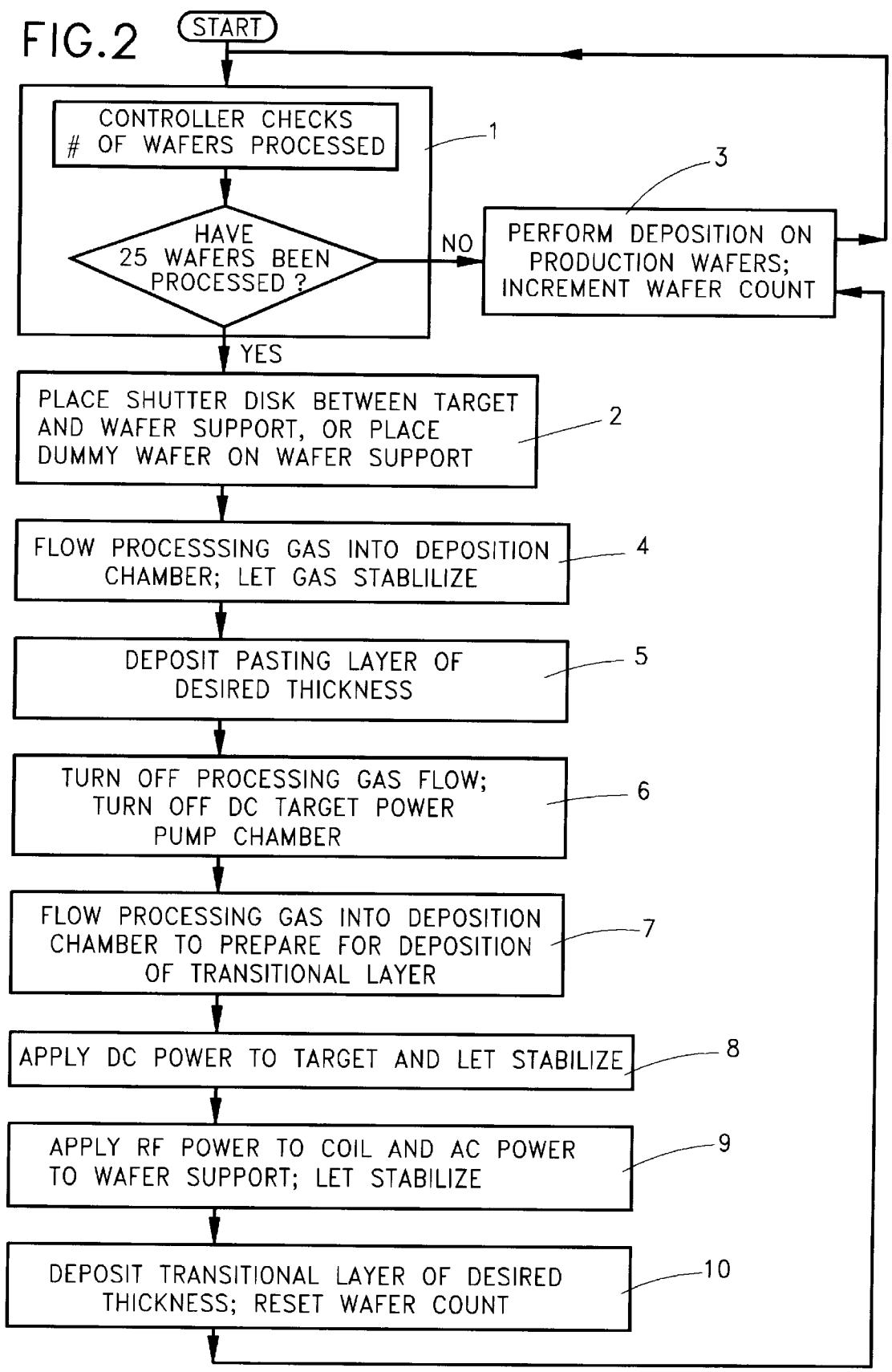

PASTING LAYER FORMATION METHOD FOR HIGH DENSITY PLASMA DEPOSITION CHAMBERS

BACKGROUND OF THE INVENTION

Semiconductor device wiring and interconnect structure is formed by layering various materials on a wafer in a prescribed pattern. Popular methods for depositing material layers include physical vapor deposition, chemical vapor deposition and the like. While these techniques produce stable material layers when deposited on an underlying wafer, material that deposits on other surfaces within the deposition chamber tends to flake or crumble as the deposition chamber thermally cycles, particularly when a significant amount of material has accumulated thereon. Such flaking or crumbling may cause wafer contamination. Accordingly, in order to reduce this type of contamination, chamber surfaces must be periodically coated with a pasting layer which prevents flaking and crumbling of the deposited material, as described below.

One of the most widely used deposition techniques (especially popular for electrical interconnect formation) is sputtering deposition. To deposit a film of material within a sputtering deposition chamber, a target of material to be deposited and a wafer (on which target material is to be deposited) are mounted within the chamber. A gas is flowed into the chamber and a negative voltage is applied to the target with respect to the chamber walls so as to excite the gas into a plasma state. As ions from the plasma bombard the target, energy is transferred from the energetic ions to the target, causing target particles to leave the target, travel in linear trajectories and deposit on the wafer.

As stated previously, sputtering deposition is often used for forming electrical interconnects within and between semiconductor devices formed on a wafer. One of the most popular interconnect materials is titanium-nitride because of its conductivity and diffusion-barrier properties. Unfortunately, titanium-nitride is brittle and when deposited alone can flake from chamber surfaces during thermal cycling. This flaking may contaminate an underlying wafer.

To prevent flaking, a pasting layer of titanium is often deposited over the titanium-nitride layer. The titanium layer bonds more tightly than titanium-nitride, and effectively glues underlying titanium-nitride layers in place on the chamber surfaces. Such titanium pasting layers are periodically deposited (e.g., every 25 wafers) on chamber surfaces to prevent deposited titanium-nitride layers from flaking therefrom. Pasting layers are most often deposited on non-production objects such as a dummy wafer or on the deposition chamber's shutter.

While pasting layers successfully reduce flaking and extend the processing time between required chamber cleaning and/or replacement of chamber parts (e.g., shields, pedestals, shutters, collimators and clamp rings), within a high density plasma deposition chamber the first production wafer processed following a pasting step (i.e., the first wafer) exhibits markedly different deposited film characteristics than the deposited film characteristics of subsequently processed production wafers (i.e., the first wafer effect occurs). Accordingly, the first wafer must be discarded.

A need therefore exists for an improved pasting process for use within a high density plasma deposition chamber that will not result in the first wafer effect.

SUMMARY OF THE INVENTION

Generally, a high density plasma deposition chamber employs a coil within a sputtering region of a vacuum chamber. The coil may have one or more turns and is placed so application of RF power to the coil generates an electric field that causes target atoms traveling through the plasma to ionize. The ionized target material is attracted to the wafer via a potential drop between the plasma region and the wafer and/or via a power signal or a voltage (i.e., a bias) applied to the wafer support and coupled therethrough to the wafer to create a voltage across the wafer (i.e., a bias voltage). The bias voltage attracts the ionized target material, causing the ionized target material to travel along a highly directional, perpendicular path. The perpendicularity of the sputtered ions' path enhances coverage of vias, trenches, and the like.

Although high density plasma deposition processes that apply a bias voltage to the wafer exhibit significantly improved coverage of surface features, it has been discovered that the bias voltage that couples to the first wafer processed following deposition of a pasting layer is not equivalent to the bias voltage that couples to wafers that are subsequently processed. Accordingly, in a high density plasma deposition chamber the first wafer processed following a pasting step may have poor or inconsistent crystal orientation and/or surface coverage as compared to subsequently processed wafers. It will be understood that as used herein the bias voltage that couples to a wafer is inferentially determined based on the readout of an AC meter coupled to the wafer support, rather than determined via direct measurement across the wafer itself.

The present invention provides a method of reducing particles within an deposition chamber, such as a high density plasma deposition chamber, yet maintaining consistent bias voltage coupling to the first wafer and to subsequently processed wafers. With use of the present invention, fewer poor quality deposited film layers result, and the cost of scrapped wafers caused by the first wafer effect is reduced. Further, the method of the present invention can be practiced with existing equipment and with very little additional processing time.

The present invention reduces particle generation by depositing a pasting layer, and overcomes the first wafer effect by depositing a transitional layer following pasting layer deposition. It is believed that the transitional layer effects the plasma composition within the deposition chamber, and the plasma composition in turn affects the efficiency with which the bias voltage couples through the wafer support to the wafer positioned thereon. While the preferred transitional layer comprises a layer of the material deposited during normal production (i.e., a production layer), other materials that affect the bias voltage's ability to couple through the wafer support to the wafer may be similarly employed.

In its preferred embodiment, within a titanium-nitride high density plasma deposition chamber, for example, the inventive process deposits a titanium pasting layer followed by a titanium-nitride transitional layer. Thus, the transitional layer changes the chamber, its surfaces and internal atmosphere, from a pasting environment (i.e., having higher concentrations of the pasting material on chamber surfaces and in the chamber's atmosphere) to a production environment (i.e., having higher concentrations of the production material on chamber surfaces and in the chamber's atmosphere). Preferably deposition of the transitional layer occurs with RF power applied to the chamber coil and thus deposition of the transitional layer also heats the chamber to the temperature employed during processing of production wafers. Most preferably the titanium-nitride transitional layer is deposited using a high density plasma deposition process, with RF coil power and DC target power levels equivalent to those employed during high density plasma deposition of titanium-nitride production layers. The inventive method may be used within any processing chamber (high density plasma deposition or otherwise) that applies a bias voltage to the wafer being processed.

Other objects, features and advantages of the present invention will become more fully apparent from the following detailed description of the preferred embodiments, the appended claims and the accompanying drawings.

BRIEF DESCRIPTION OF THE DRAWINGS

FIG. 2 is a flow diagram for explaining various preferred aspects of the present invention, and for generally outlining a control program for controlling a deposition system in accordance with the present invention.

DETAILED DESCRIPTION OF THE PREFERRED EMBODIMENTS

Figure 1A:
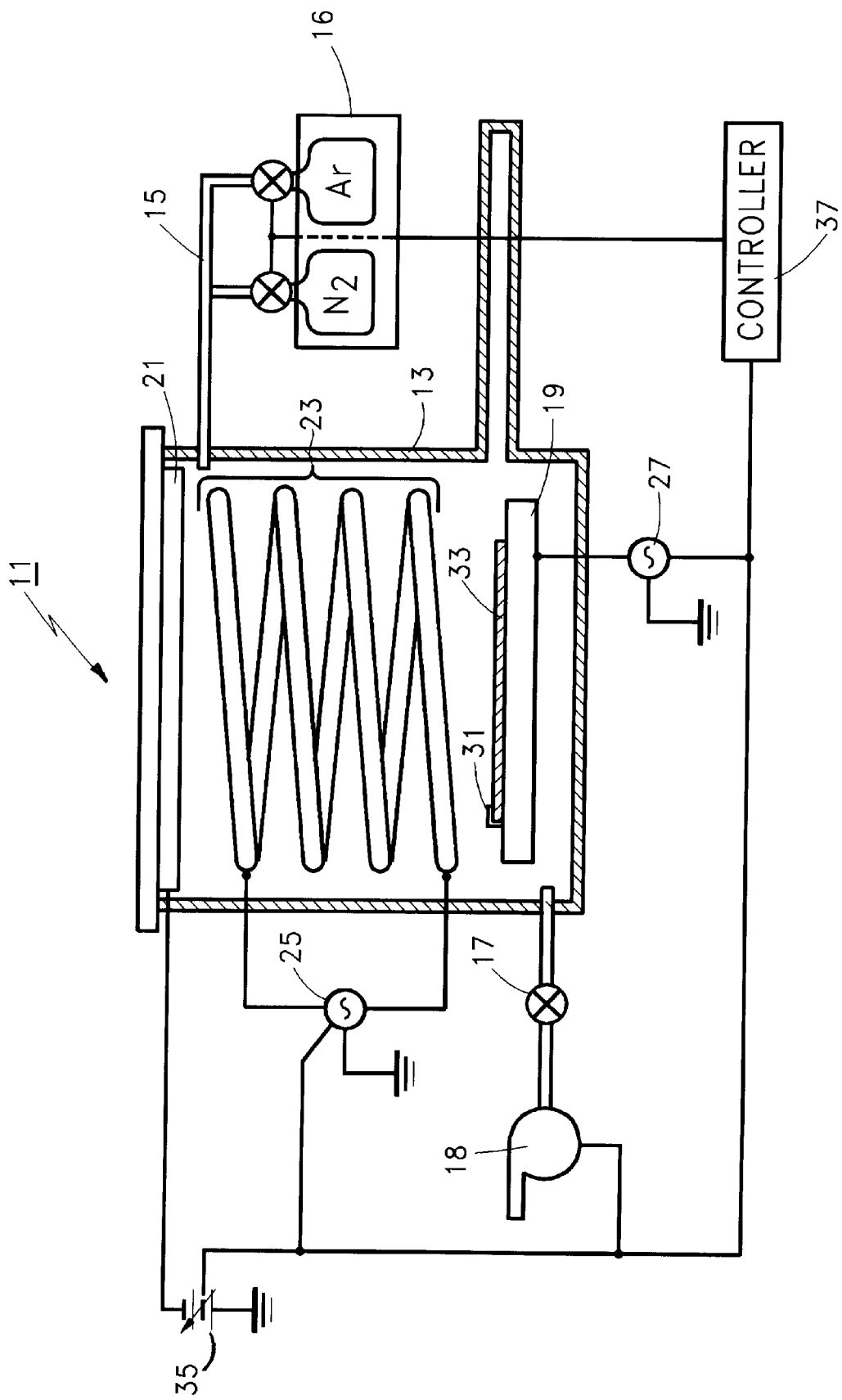
FIGS. 1A and 1B are diagrammatic illustrations, in section, of the pertinent portions of a high density plasma deposition chamber 11 for practicing the present invention.

FIG. 1A is a diagrammatic illustration, in section, of the pertinent portions of an exemplary high density plasma deposition chamber 11 for employing the present invention. The high density plasma deposition chamber 11 generally includes a vacuum chamber enclosure wall 13 having at least one gas inlet 15 coupled to a processing gas source 16, and an exhaust outlet 17 coupled to an exhaust pump 18. A wafer support 19 is disposed at the lower end of the high density plasma deposition chamber 11, and a sputtering target 21 is mounted to the upper end of the high density plasma deposition chamber 11. The high density plasma deposition chamber 11 contains a coil 23 which is operatively coupled to an RF power supply 25. As shown in FIG. 1A the coil 23 is positioned along the inner surface of the high density plasma deposition chamber 11, between the sputtering target 21 and the wafer support 19. An AC power supply 27 is operatively coupled to the wafer support 19 so that an AC power signal emitted from the AC power supply 27 may couple through the wafer support 19 to a wafer 29 positioned thereon (see FIG. 1B).

A clamp ring 31 is operatively coupled to the wafer support 19 so as to press the wafer 29 (see FIG. 1B) uniformly against the wafer support 19. A shutter assembly (not shown) is rotatably mounted within the high density plasma deposition chamber 11 for selectively positioning a shutter disk 33 between the target 21 and the remainder of the high density plasma deposition chamber 11 (i.e., placing the shutter disk 33 in a closed position). Thus when positioned in the closed position deposition material is prevented from depositing on surfaces below the shutter disk 33. Preferably the shutter disk 33 is positioned so as to be between the clamp ring 31 and the wafer support 19 when the shutter disk 33 is in the closed position (as shown in FIG. 1A).

The target 21 is electrically isolated from enclosure wall 13. Enclosure wall 13 is preferably grounded so that a negative voltage may be maintained on the target 21 (with respect to grounded enclosure wall 13) via a DC power supply 35. A controller 37 is operatively coupled to the RF power supply 25, the DC power supply 35, the gas inlet 15, the exhaust outlet 17 and the AC power supply 27.

Figure 1B:
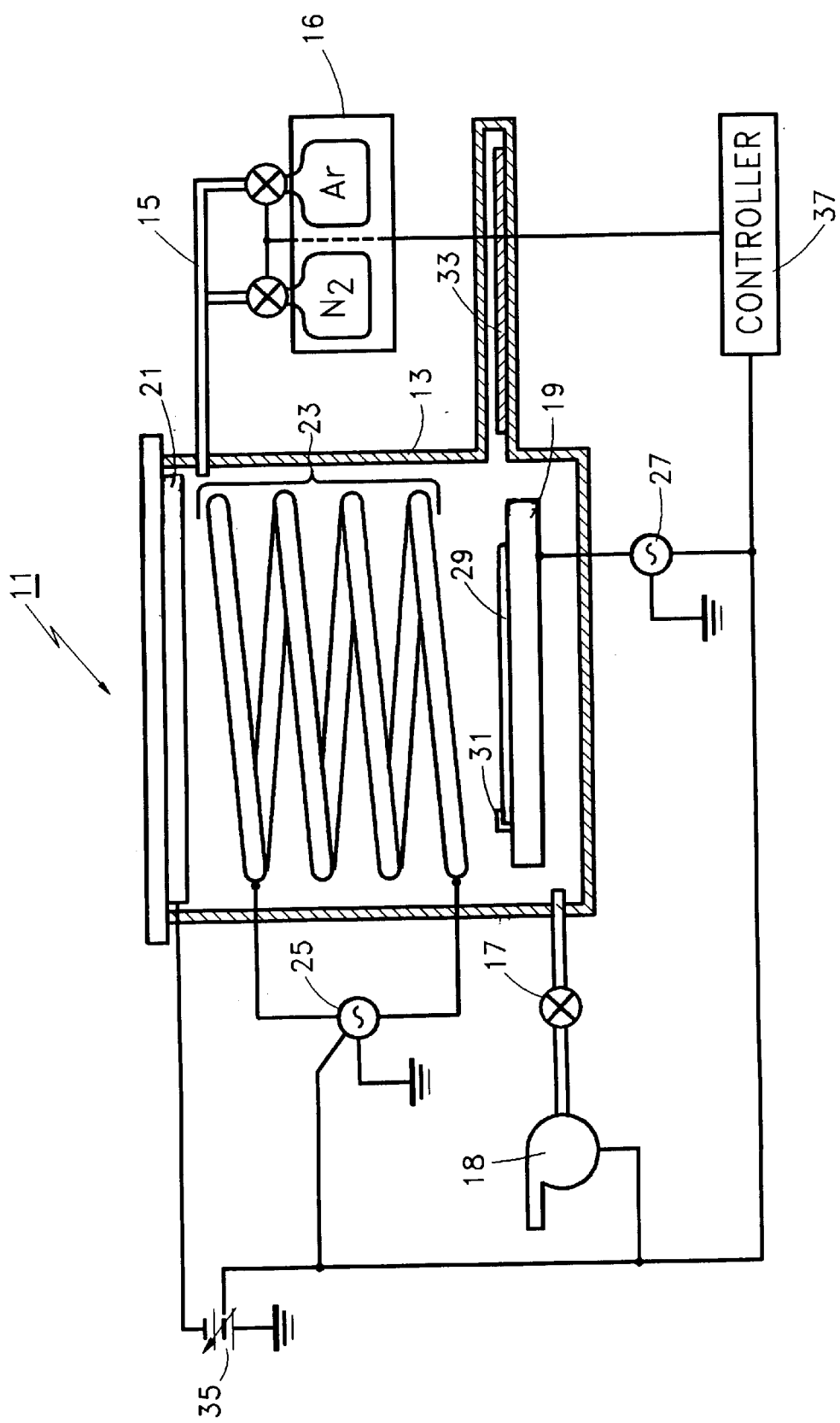

FIG. 1B shows the high density plasma deposition chamber 11 of FIG. 1A with the shutter disk 33 in the open position, and with the clamp ring 31 pressing the wafer 29 against the wafer support 19.

In this example assume that the high density plasma deposition chamber 11 is configured for deposition of titanium-nitride layers and the inventive method is employed in order to achieve consistent bias voltage coupling between the wafer support 19 and the wafer 29 whether immediately following a pasting process or during subsequent steady-state processing. Further, assume the specific deposition process requires both argon and nitrogen gas ("process argon" and "process nitrogen") to be flowed into the high density plasma deposition chamber 11 through the gas inlet 15, while a 1.5 kilowatt power signal is applied to the coil 23 via the RF power supply 25, a 3.75 kilowatt power signal is applied to the target 21 via the DC power supply 35 and a 40 watt power signal is applied to the wafer support 19 via the AC power supply 27. The inventive pasting process is described in detail below with reference to both the flow diagram of FIG. 2 and the high density plasma deposition chamber 11 described above. It will be understood however, that the configuration of the high density plasma deposition chamber described above, and the specific process parameters provided below are merely exemplary.

Referring to FIG. 2, as represented by block 1 a controller (referenced generally by the number "37" in FIG. 2) determines whether a predetermined amount of titanium-nitride has been deposited (in this example, whether twenty-five wafers have been processed) within the deposition chamber 11 since deposition of the last pasting layer. The predetermined amount of titanium-nitride deposited prior to entry of the pasting process is selected so that pasting occurs just prior to the point of expected titanium-nitride flaking. If twenty-five wafers have been processed, the controller 37 then executes the inventive pasting process (described below); otherwise the controller 37 continues depositing titanium-nitride layers (block 3) and maintaining a count of the number of wafers processed.

Assuming twenty-five wafers have been processed, the processing chamber's shutter disk 33 is placed between the target 21 and the wafer support 19, or a dummy wafer is placed within the high density plasma deposition chamber 11 (as represented by block 2) so that the pasting layer may be deposited thereon.

Thereafter, the processing gas is flowed into the high density plasma deposition chamber 11 as indicated by block 4 and preferably is allowed to stabilize before the process proceeds to block 5. In this example, process argon (free from nitrogen) is flowed into the high density plasma deposition chamber 11 at a rate of 40 standard cubic centimeters per minute (s.c.c.m.) for 12 seconds before proceeding to block 5.

In block 5 a titanium pasting layer is deposited. For example, an 8 kilowatt DC power signal is applied to the target 21 at a ramp rate of 8 kilowatts per second. The DC target voltage excites a plasma causing argon ions to bombard the target 21 and to eject target particles therefrom. Meanwhile process argon continues to flow into the high density plasma deposition chamber 11 at a rate of 40 s.c.c.m. After approximately 300 seconds, a titanium pasting layer sufficiently thick to cover and capture the titanium-nitride layer has been deposited on the chamber's internal surfaces which are exposed to the deposition surface of the wafer, such as the shield and clamp ring. The process then proceeds to block 6, where the processing gas flow is turned off, the DC power applied to the target 21 is turned off and the high density plasma deposition chamber 11 is pumped to a desired vacuum level.

Subsequently, as indicated by block 7, the high density plasma deposition chamber 11 is prepared for deposition of a titanium-nitride high density plasma deposition layer. The required processing gasses are flowed into the high density plasma deposition chamber 11 and allowed to stabilized. For example, 5 s.c.c.m. of process argon, 95 s.c.c.m. of process nitrogen and 15 s.c.c.m. of "heater" argon (flowed between the wafer and the wafer support and then into the deposition chamber 11 to aid heat transfer between the wafer and the wafer support) are flowed into the high density plasma deposition chamber 11 for ten seconds.

The process then proceeds to block 8 where a DC power signal is applied to the target 21 and allowed to stabilize. Specifically a 3.75 kilowatt DC power signal is applied to the target 21 at a ramp rate of 800 Watts per second while the processing gas mixture continues to flow into the high density plasma deposition chamber 11 at the previously described rate. After five seconds the target 21 reaches 3.75 kilowatts and the process proceeds to block 9.

As represented by block 9, an RF power signal is applied to the coil 23, and an AC power signal is applied to the wafer support 19; both power signals are allowed to stabilize while the processing gases continue to flow into the high density plasma deposition chamber 11. Meanwhile, the 3.75 kilowatt DC power signal applied to the target 21 is maintained. For example, a 1.5 kilowatt RF power signal may be applied to the coil 23 at a ramp rate of 500 Watts per second and an AC bias of 350 watts may be applied to the wafer support 19 at a rate of 100 watts per second. After five seconds the power signals applied to the coil 23 and to the wafer support 19 will be stable.

The process then proceeds to block 10 wherein a titanium-nitride transitional layer is deposited on the shutter or dummy wafer via a high density plasma deposition process. The 3.75 kilowatt DC power signal applied to the target 21, the 1.5 kilowatt RF power signal applied to the coil 23 and the processing gas flow are all maintained. Depending on the specific configuration of the deposition chamber 11 and its components, the AC power signal applied to the wafer support 19 is either maintained or reduced (e.g., to 40 watts). Deposition of titanium-nitride continues for about 94 seconds; thereafter, the process proceeds to block 10 where the power signals applied to the coil 23, the target 21 and the wafer support 19 are turned off, the flow of processing gases stops and the high density plasma deposition chamber 11 is pumped to a desired vacuum level. The controller 37 then exits the inventive pasting process, and titanium-nitride may be deposited on twenty-five subsequent production wafers before the inventive pasting process is again executed (block 3).

The first layer of titanium-nitride deposited immediately following execution of the inventive pasting process described above will exhibit the same quality as layers deposited during steady-state processing (i.e., during processing of wafers 2–25). The entire pasting process takes a relatively small amount of time and requires no additional equipment. Accordingly, the inventive pasting process not only provides consistent film quality and reduces scrapped wafer costs, it does so efficiently and cost effectively.

The foregoing description discloses only the preferred embodiments of the invention, modifications of the above disclosed apparatus and method which fall within the scope of the invention will be readily apparent to those of ordinary skill in the art. For instance, as previously discussed, transitional layers other than the layer deposited on production wafers may be employed. Further, although the DC and RF power signals applied during deposition of the transitional layer are most preferably the same as those applied during deposition on production wafers, each power signal may vary over a range of values. However, the presently preferred values are; an RF power signal in the range of 0.5 kilowatts to 10 kilowatts applied to the coil, a DC power signal in the range of 0.5 kilowatts to 30 kilowatts applied to the target and a power signal in the range of 5 watts to 1,000 watts applied to the wafer support, or a voltage in the range of 0 to 500 volts (most typically 100 volts) applied to the wafer support.

Accordingly, while the present invention has been disclosed in connection with the preferred embodiments thereof, it should be understood that other embodiments may fall within the spirit and scope of the invention, as defined by the following claims.

The invention claimed is:

1. A method of reducing particles within a high density plasma deposition chamber employing a deposition chamber coil, the high density plasma deposition chamber configured for depositing a production layer by sputtering a target, the method comprising:

depositing a pasting layer on a non-production object within the high density plasma deposition chamber by sputtering the target; and after depositing the pasting layer, depositing a transitional layer on the non-production object, wherein the transitional layer comprises a production layer that is formed by sputtering the target and that transitions the high density plasma deposition chamber from a pasting environment to an environment in which a bias applied to a wafer support within the high density plasma deposition chamber couples to a first production wafer during a first cycle and couples to a second production wafer during a second cycle in substantially equivalent amounts.

2. The method of claim 1 wherein depositing a transitional layer on the non-production object comprises:

pumping the deposition chamber to remove processing gases present during deposition of the pasting layer;

after pumping the deposition chamber, flowing processing gas into the deposition chamber;

applying a voltage to the target; and depositing a production layer and thereby transitioning the deposition chamber's environment from the pasting environment to a production environment having a concentration of the production material which is higher than the concentration of the pasting material; such that the first production layer deposited on the first production object has the same quality as subsequently deposited layers.

3. The method of claim 2 further comprising applying an RF power signal to the deposition chamber coil while depositing the production layer on the non-production object.

4. The method of claim 3 further comprising applying a bias voltage to the wafer support while depositing the production layer on the non-production object.

5. The method of claim 4 wherein the RF power signal applied to the deposition chamber coil and the bias voltage applied to the wafer support while depositing the production layer on the non-production object is the same level as that applied during deposition on the production objects.

6. The method of claim 5 wherein depositing a production layer on the non-production object comprises depositing a production layer on the non-production object until the pasting material and the production material are present within the deposition chamber's atmosphere after deposition of the production layer on the non-production object in a first and a second amount, respectively, that is equivalent to an amount of pasting material and an amount of production material within the deposition chamber's atmosphere after deposition of the production layer on a production object.

7. The method of claim 1 wherein the transitional layer is a production layer.

8. The method of claim 1 wherein the depositing of the transitional layer comprises applying an RF power signal to a deposition chamber coil while depositing the transitional layer.

9. The method of claim 1 wherein the depositing of the transitional layer comprises applying a DC power signal to a deposition chamber target while depositing the transitional layer.

10. The method of claim 1 wherein the transitional layer is a production layer and wherein the depositing of the transitional layer comprises applying an RF power signal to a deposition chamber coil while depositing the transitional layer.

11. The method of claim 10 wherein the RF power signal applied to the deposition chamber coil is in the range of 0.5–10 kilowatts.

12. The method of claim 10 wherein depositing the transitional layer heat s the deposition chamber to a production temperature.

13. The method of claim 10 wherein the depositing the transitional layer changes the deposition chamber atmosphere from a pasting atmosphere to a production atmosphere.

14. The method of claim 10 wherein the pasting layer is a titanium layer, and wherein the transitional layer is a titanium-nitride layer.

15. A semiconductor wafer processed in accordance with the method of claim 10.

16. The method of claim 1 wherein the transitional layer is a production layer and wherein the depositing of the transitional layer comprises applying both an RF power signal to a deposition chamber coil and applying a DC power signal to a deposition chamber target while depositing the transitional layer.

17. The method of claim 16 wherein the DC power signal applied to the deposition chamber target is in the range of 0.5–30 kilowatts.

18. The method of claim 16 wherein the bias applied to the wafer support is in the range of 5–1,000 watts.

19. The method of claim 1 wherein the depositing of the transitional layer comprises applying both an RF power signal to a deposition chamber coil and applying a DC power signal to a deposition chamber target while depositing the transitional layer.

20. The method of claim 1 wherein the transitional layer is a production layer and wherein the depositing of the transitional layer comprises applying a DC power signal to a deposition chamber target while depositing the transitional layer.

* * * * *